(12) United States Patent
Hsieh

(10) Patent No.: US 12,418,297 B2
(45) Date of Patent: Sep. 16, 2025

(54) CAPACITOR WEIGHTED SEGMENTATION BUFFER

(71) Applicant: MEDIATEK INC., Hsin-Chu (TW)

(72) Inventor: Sung-En Hsieh, Hsinchu (TW)

(73) Assignee: MEDIATEK INC., Hsinchu (TW)

(*) Notice: Subject to any disclaimer, the term of this patent is extended or adjusted under 35 U.S.C. 154(b) by 205 days.

(21) Appl. No.: 18/208,878

(22) Filed: Jun. 12, 2023

(65) Prior Publication Data

US 2024/0039546 A1    Feb. 1, 2024

Related U.S. Application Data

(60) Provisional application No. 63/376,125, filed on Sep. 19, 2022, provisional application No. 63/369,673,
(Continued)

(51) Int. Cl.
  *H03M 1/66* (2006.01)
  *H03M 1/00* (2006.01)

(52) U.S. Cl.
  CPC .................................. *H03M 1/002* (2013.01)

(58) Field of Classification Search
  CPC .... H03M 1/468; H03M 1/804; H03M 1/1245; H03M 1/466; H03M 1/002; H03M 1/462; H03M 1/0682; H03M 1/42; H03M 3/458; H03M 1/164; H03M 1/38; H03M 1/68; H03M 1/765; H03M 1/802; H03M 1/82;
  (Continued)

(56) References Cited

U.S. PATENT DOCUMENTS 4,644,291 A * 2/1987 Masuda ................. H03F 3/2171
                                                             330/261
6,144,331 A * 11/2000 Jiang .................... H03M 1/0682
                                                             341/172
(Continued)

FOREIGN PATENT DOCUMENTS

TW          202143067 A      11/2021
WO       2021/158861 A1       8/2021

OTHER PUBLICATIONS

Xie et al., eDRAM-CIM: Compute-In-Memory Design with Reconfigurable Embedded-Dynamic-Memory Array Realizing Adaptive Data Converters and Charge-Domain Computing, ISSCC 2021 / Session 16 / Computation in Memory / 16.2, pp. 248-249 and a page including Figure 16.2.7, 2021.
(Continued)

*Primary Examiner* — Linh V Nguyen
(74) *Attorney, Agent, or Firm* — Winston Hsu

(57) ABSTRACT

A capacitor weighted segmentation buffer includes a push-pull buffer circuit and a plurality of capacitors. The capacitors include a first capacitor having a first terminal coupled to a control terminal of the first transistor and a second terminal arranged to receive a first input signal; a second capacitor having a first terminal coupled to a control terminal of the second transistor and a second terminal arranged to receive the first input signal; a third capacitor having a first terminal coupled to the control terminal of the first transistor and a second terminal arranged to receive a second input signal; and a fourth capacitor having a first terminal coupled to the control terminal of the second transistor and a second terminal arranged to receive the second input signal.

17 Claims, 9 Drawing Sheets

Related U.S. Application Data filed on Jul. 28, 2022, provisional application No. 63/369,674, filed on Jul. 28, 2022.

(58) Field of Classification Search
CPC ........ H03M 3/426; H03M 1/00; H03M 1/069; H03M 1/0845; H03M 1/0863; H03M 1/10; H03M 1/1009; H03M 1/1215; H03M 1/124; H03M 1/145; H03M 1/146; H03M 1/36; H03M 1/365; H03M 1/366; H03M 1/368; H03M 1/46; H03M 1/50; H03M 1/66; H03M 1/664; H03M 1/687; H03M 1/742; H03M 1/747; H03M 3/346; H03M 7/16; H03M 7/165; H03M 7/3042
USPC .......................................... 341/144, 150, 172
See application file for complete search history.

(56) References Cited

U.S. PATENT DOCUMENTS

| | | | | |
|---|---|---|---|---|
| 6,778,009 | B1* | 8/2004 | Lee | H03F 3/45475 330/69 |
| 7,916,198 | B2* | 3/2011 | Yeom | H03F 3/45659 348/308 |
| 8,836,420 | B2* | 9/2014 | Kimura | G11C 27/028 330/264 |
| 9,154,089 | B2* | 10/2015 | Lee | H03H 19/004 |
| 9,455,731 | B1* | 9/2016 | Gutta | H03M 1/002 |
| 10,833,685 | B1* | 11/2020 | Chakraborty | H03B 5/1296 |
| 11,038,512 | B2* | 6/2021 | Yang | H03L 7/099 |
| 11,043,948 | B1* | 6/2021 | Lekkala | H03F 3/303 |
| 2007/0054629 | A1* | 3/2007 | Maligeorgos | H04L 27/0002 455/73 |
| 2009/0185406 | A1* | 7/2009 | Uno | H03F 3/4565 363/131 |
| 2012/0026027 | A1* | 2/2012 | Steensgaard-Madsen | H03M 1/466 341/161 |
| 2021/0295905 | A1 | 9/2021 | Lee | |
| 2022/0012016 | A1 | 1/2022 | Wang | |
| 2022/0013155 | A1 | 1/2022 | Kumar | |
| 2022/0309328 | A1* | 9/2022 | Saxena | G11C 16/0433 |

OTHER PUBLICATIONS

Hongyang Jia et al., Scalable and Programmable Neural Network Inference Accelerator Based on In-Memory Computing, IEEE Journal of Solid-State Circuits, Jan. 2022, pp. 198-211, vol. 57, No. 1, IEEE, XP093051677, Jan. 2022.

Sung-En Hsieh et al., 7.6 A 70.85-86.27TOPS/W PVT-Insensitive 8b Word-Wise ACIM with Post-Processing Relaxation, ISSCC 2023 / Session 7 / SRAM Compute-In-Memory / 7.6, 2023 IEEE International Solid-State Circuits Conference, Feb. 21, 2023, pp. 136-138, 2023 IEEE, XP034314958, Feb. 21, 2023.

Hsieh, the specification, including the claims, and drawings in the U.S. Appl. No. 18/215,175, filed Jun. 28, 2023.

Dong et al., A 351TOPS/W and 372.4GOPS Compute-in-Memory SRAM Macro in 7nm FinFET CMOS for Machine-Learning Applications, ISSCC 2020 / Session 15 / SRAM & Compute-In-Memory / 15.3, pp. 242-243 and a page including 15.3.7, 2020.

Wu et al., A 28nm 1Mb Time-Domain Computing-in-Memory 6T-SRAM Macro with a 6.6ns Latency, 1241GOPS and 37.01Tops/W for 8b-MAC Operations for Edge-AI Devices, ISSCC 2022 / Session 11 / Compute-In-Memory and SRAM / 11.8, pp. 190-191 and a page including Figure 11.8.7, 2022.

Jia et al., A Programmable Neural-Network Inference Accelerator Based on Scalable In-Memory Computing, ISSCC 2021 / Session 15 / Compute-In-Memory Processors for Deep Neural Networks / 15.1, pp. 236-237 and a page including Figure 15.1.7, 2021.

Khwa et al., A 40-nm, 2M-Cell, 8b-Precision, Hybrid SLC-MLC PCM Computing-in-Memory Macro with 20.5-65.0Tops/W for Tiny-AI Edge Devices, ISSCC 2022 / Session 11 / Compute-In-Memory and SRAM / 11.3, pp. 180-181 and a page including Figure 11.3.7, 2022.

Yan et al., A 1.041-Mb/mm2 27.38-Tops/W Signed-INT8 Dynamic-Logic-Based ADC-less SRAM Compute-In-Memory Macro in 28nm with Reconfigurable Bitwise Operation for AI and Embedded Applications, ISSCC 2022 / Session 11 / Compute-In-Memory and SRAM / 11.7, pp. 188-189 and a page including Figure 11.7.7, 2022.

Chih et al., An 89Tops/W and 16.3TOPS/mm2 All-Digital SRAM-Based Full-Precision Compute-In Memory Macro in 22nm for Machine-Learning Edge Applications, ISSCC 2021 / Session 16 / Computation in Memory / 16.4, pp. 252-253 and a page including Figure 16.4.7, 2021.

Chenyaofo, pytorch-cifar-models. [Online]. Available : https://github.com/chenyaofo/pytorch-cifar-models, 2021.

Hershberg et al., A 3.2GS/s 10 ENOB 61mW Ringamp ADC in 16nm with Background Monitoring of Distortion, ISSCC 2019 / Sessuib 3 / Nyquist Rate ADCs / 3.1, pp. 58-59 and a page including Figure 3.1.7, 2019.

\* cited by examiner

CAPACITOR WEIGHTED SEGMENTATION BUFFER

CROSS REFERENCE TO RELATED APPLICATIONS

This application claims the benefit of U.S. Provisional Application No. 63/369,673, filed on Jul. 28, 2022. Further, this application claims the benefit of U.S. Provisional Application No. 63/369,674, filed on Jul. 28, 2022. Further, this application claims the benefit of U.S. Provisional Application No. 63/376,125, filed on Sep. 19, 2022. The contents of these applications are incorporated herein by reference.

BACKGROUND

The present invention relates to a buffer circuit design, and more particularly, to a capacitor weighted segmentation buffer with low power consumption, ultra-small area, and high accuracy.

A digital-to-analog converter (DAC) is used for converting a digital input into an analog output. A buffer is used to buffer or drive an analog input to generate and output an analog output to a following processing stage. DACs and buffers are common components in a variety of circuits. In general, the buffers can be categorized into open-loop buffers and closed-loop buffers. The open-loop buffers suffer from process, voltage, temperature (PVT) variations. In addition, a typical circuit design generally uses a separate DAC to work with an open-loop buffer, which results in a large chip area due to lack of integration. The closed-loop buffers achieve the wanted stability/phase margin performance at the expense of speed and energy. Thus, there is a need for an innovative buffer with low power consumption, ultra-small area, and high accuracy.

As mentioned above, DACs and buffers are common components in a variety of circuits. For example, a convolutional neural network (CNN) used by an artificial intelligence (AI) application is made up of neurons that have learnable weights. Each neuron receives AI inputs, and performs a dot product (i.e., a convolution operation) upon AI inputs and weights. One conventional approach may employ a central processing unit (CPU) to deal with the convolution operations, which is not a power-efficient solution. Another conventional approach may employ a bit-wise current-based or time-based compute-in-memory (CIM) circuit to deal with the convolution operations, which is neither a power-efficient solution nor a high-accuracy solution. Thus, there is a need for an innovative buffer with low power consumption, ultra-small area, and high accuracy that can meet the requirements of an ACIM circuit used by an AI application.

SUMMARY

One of the objectives of the claimed invention is to provide a capacitor weighted segmentation buffer with low power consumption, ultra-small area, and high accuracy. For example, the capacitor weighted segmentation buffer may be integrated with a digital-to-analog converter. For another example, the capacitor weighted segmentation buffer may be an analog compute-in-memory buffer.

According to an aspect of the present invention, an exemplary capacitor weighted segmentation buffer is disclosed. The exemplary capacitor weighted segmentation buffer includes a push-pull buffer circuit and a plurality of capacitors. The push-pull buffer circuit includes a first transistor having a control terminal, a first connection terminal, and a second connection terminal, and a second transistor having a control terminal, a first connection terminal, and a second connection terminal, wherein the second connection terminal of the first transistor and the second connection terminal of the second transistor are coupled to an output node of the capacitor weighted segmentation buffer. The capacitors include a first capacitor having a first terminal coupled to the control terminal of the first transistor and a second terminal arranged to receive a first input signal of the capacitor weighted segmentation buffer; a second capacitor having a first terminal coupled to the control terminal of the second transistor and a second terminal arranged to receive the first input signal of the capacitor weighted segmentation buffer; a third capacitor having a first terminal coupled to the control terminal of the first transistor and a second terminal arranged to receive a second input signal of the capacitor weighted segmentation buffer; and a fourth capacitor having a first terminal coupled to the control terminal of the second transistor and a second terminal arranged to receive the second input signal of the capacitor weighted segmentation buffer. Each of the first capacitor and the second capacitor has a first capacitance value, and each of the third capacitor and the fourth capacitor has a second capacitance value different from the first capacitance value.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
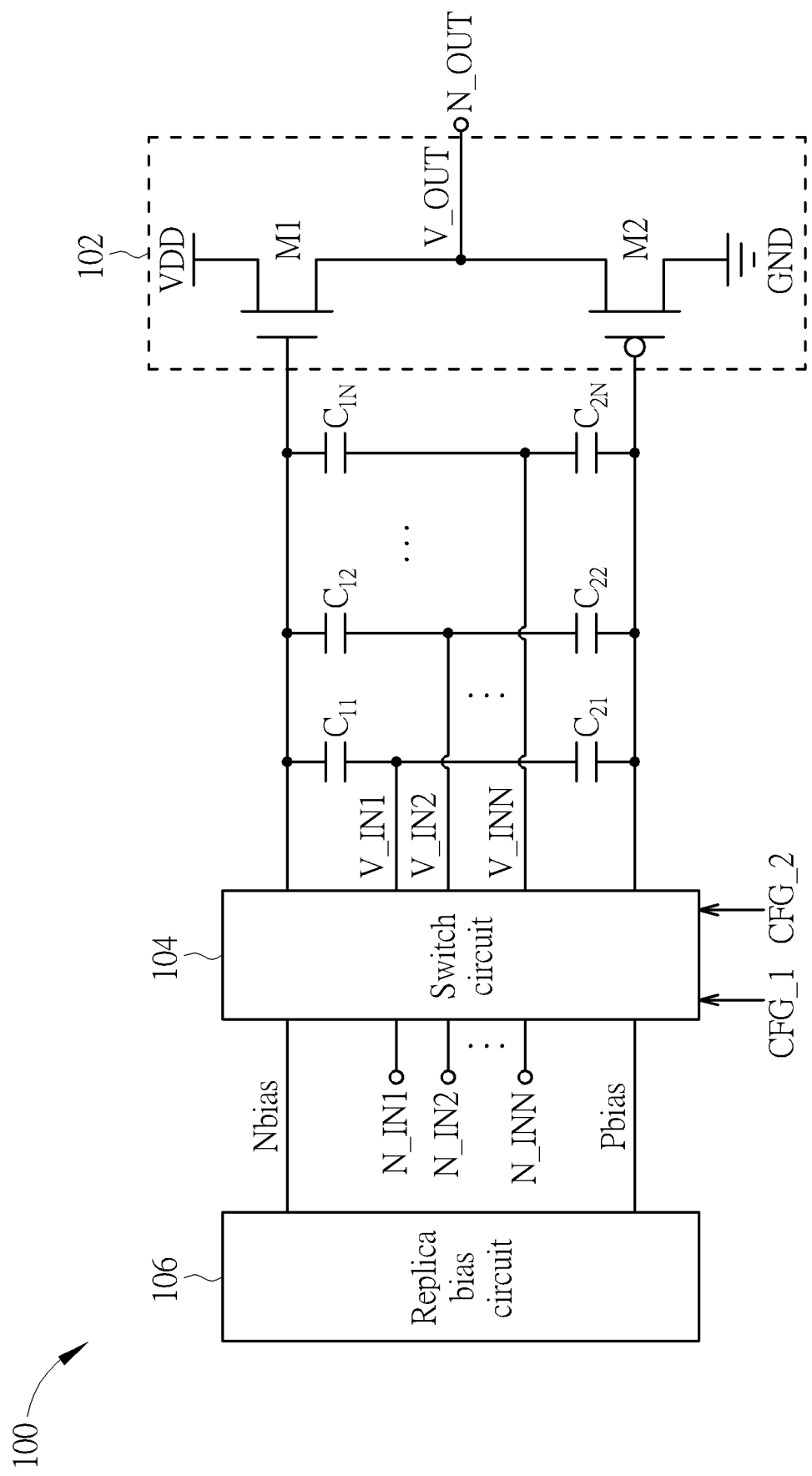
FIG. 1 is a diagram illustrating a capacitor weighted segmentation buffer according to an embodiment of the present invention.

FIG. 1 is a diagram illustrating a capacitor weighted segmentation buffer according to an embodiment of the present invention. The capacitor weighted segmentation buffer 100 includes a push-pull buffer circuit 102, a plurality of capacitors $C_{11}$-$C_{1N}$ and $C_{21}$-$C_{2N}$ (N≥2), a switch circuit 104, and a replica bias circuit 106. The push-pull buffer circuit 102 includes two transistors M1 and M2. For example, the transistor M2 may be implemented by a P-channel metal-oxide-semiconductor (PMOS) transistor, and the transistor M1 may be implemented by an N-channel metal-oxide-semiconductor (NMOS) transistor. As shown in FIG. 1, the transistor (e.g., NMOS transistor) M1 has a control terminal (e.g., gate terminal) and two connection terminals (e.g., source terminal and drain terminal), where one connection terminal (e.g., drain terminal) is coupled to a reference voltage (e.g., supply voltage VDD), and the other connection terminal (e.g., source terminal) is coupled to an output node N_OUT of the capacitor weighted segmentation buffer 100. In addition, the transistor (e.g., PMOS transistor) M2 has a control terminal (e.g., gate terminal) and two connection terminals (e.g., source terminal and drain terminal), where one connection terminal (e.g., drain terminal) is coupled to another reference voltage (e.g., ground voltage GND), and the other connection terminal (e.g., source terminal) is coupled to the output node N_OUT of the capacitor weighted segmentation buffer 100. In some embodiments of the present invention, the output node N_OUT of the capacitor weighted segmentation buffer 100 is coupled to a following processing stage. In other words, the capacitor weighted segmentation buffer 100 may act as an output buffer or output driver for driving the following processing stage. For example, the following processing stage may be an ACIM circuit.

The capacitor $C_{11}$ has a first terminal (e.g., top plate) coupled to the control terminal of the transistor M1 and a second terminal (e.g., bottom plate) arranged to receive a first input signal V_IN1 of the capacitor weighted segmentation buffer 100. The capacitor $C_{21}$ has a first terminal (e.g., bottom plate) coupled to the control terminal of the transistor M2 and a second terminal (e.g., top plate) arranged to receive the first input signal V_IN1 of the capacitor weighted segmentation buffer 100. The capacitor $C_{12}$ has a first terminal (e.g., top plate) coupled to the control terminal of the transistor M1 and a second terminal (e.g., bottom plate) arranged to receive a second input signal V_IN2 of the capacitor weighted segmentation buffer 100. The capacitor $C_{22}$ has a first terminal (e.g., bottom plate) coupled to the control terminal of the transistor M2 and a second terminal (e.g., top plate) arranged to receive the second input signal V_IN2 of the capacitor weighted segmentation buffer 100. The capacitor $C_{1N}$ has a first terminal (e.g., top plate) coupled to the control terminal of the transistor M1 and a second terminal (e.g., bottom plate) arranged to receive an $N^{th}$ input signal V_INN of the capacitor weighted segmentation buffer 100. The capacitor $C_{2N}$ has a first terminal (e.g., bottom plate) coupled to the control terminal of the transistor M2 and a second terminal (e.g., top plate) arranged to receive the $N^{th}$ input signal V_INN of the capacitor weighted segmentation buffer 100.

Both of the capacitors $C_{1i}$ and $C_{2i}$ have the same capacitance value $CV_i$, where i={1, 2, . . . , N}. In addition, the capacitance values $CV_1$-$CV_N$ include different capacitance values. For example, the capacitance value $CV_1$ is larger than each of the capacitance values $CV_2$ and $CV_N$, and the capacitance value $CV_2$ is larger than the capacitance value $CV_N$. For another example, the capacitors $C_{11}$, $C_{12}$, . . . , $C_{1N}$ form one binary weighted capacitor array, and the capacitors $C_{21}$, $C_{22}$, . . . , $C_{2N}$ form another binary weighted capacitor array. However, these are for illustrative purposes only, and are not meant to be limitations of the present invention. In practice, settings of the capacitance values $CV_1$-$CV_N$ can be adjusted, depending upon actual design considerations. Furthermore, the number of capacitors $C_{11}$-$C_{1N}$ and $C_{21}$-$C_{2N}$ (N≥2) can be adjusted, depending upon actual design considerations.

In this embodiment, the push-pull buffer circuit 102 operates as a discrete-time push-pull buffer. Specifically, the discrete-time operation of the push-pull buffer circuit 102 includes a first phase in which the push-pull buffer circuit 102 operates in a reset (RST) mode and a second phase in which the push-pull buffer circuit 102 operates in a buffer (BUF) mode. The mode switching of the push-pull buffer circuit 102 is controlled by the switch circuit 104 that may be implemented using a plurality of switches. Specifically, the switch circuit 104 is arranged to support two configurations CFG_1 and CFG_2. When the switch circuit 104 is controlled to have the configuration CFG_1 (which is defined by ON/OFF statues of switches in the switch circuit 104), the push-pull buffer circuit 102 operates in the RST mode. When the switch circuit 104 is controlled to have the configuration CFG_2 (which is defined by ON/OFF statues of switches in the switch circuit 104), the push-pull buffer circuit 102 operates in the BUF mode.

Figure 2:
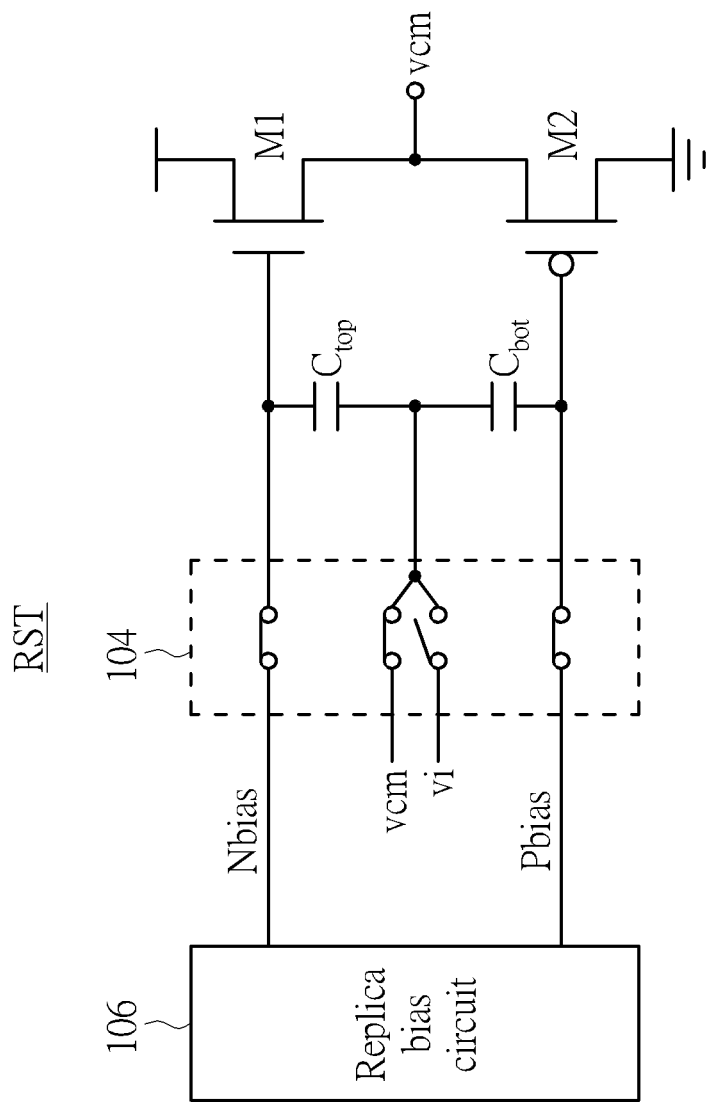
FIG. 2 is a diagram illustrating a first phase (e.g., RST mode) of a discrete operation performed at the capacitor weighted segmentation buffer shown in FIG. 1 according to an embodiment of the present invention.
Figure 3:
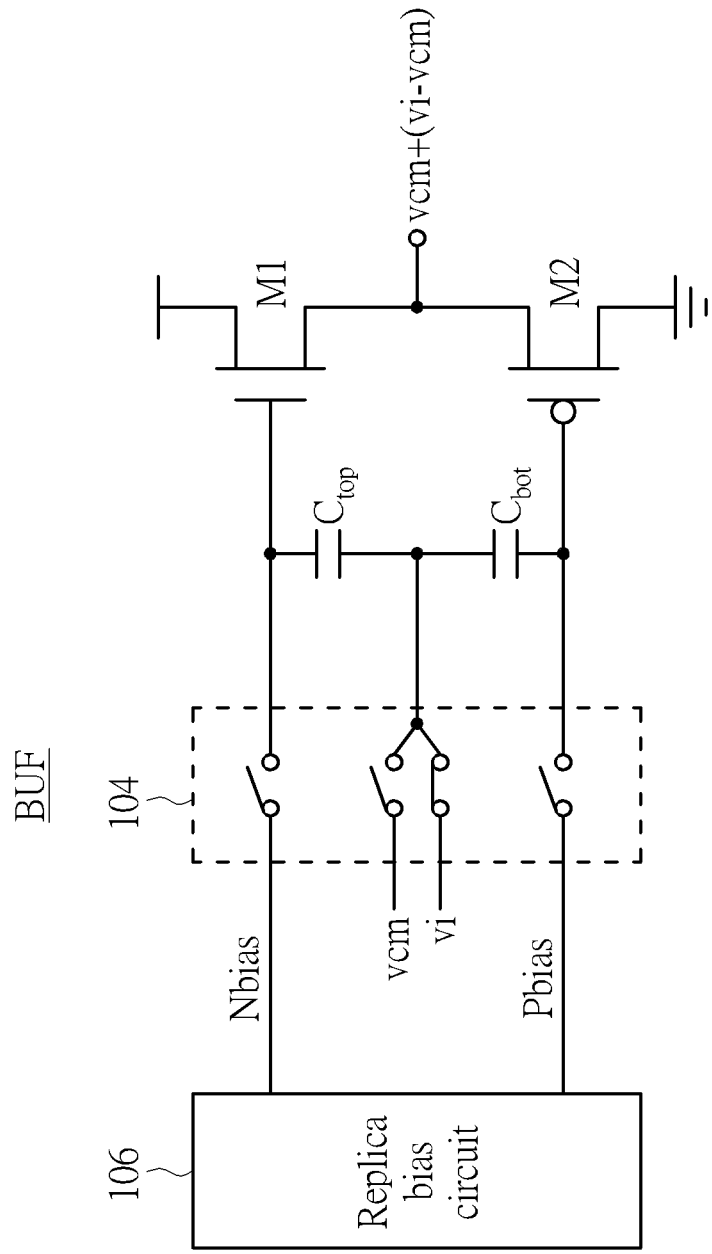
FIG. 3 is a diagram illustrating a second phase (e.g., BUF mode) of the discrete operation performed at the capacitor weighted segmentation buffer shown in FIG. 1 according to an embodiment of the present invention.

As shown in FIG. 1, the switch circuit 104 is coupled between the replica bias circuit 106 and the control terminals of the transistors M1 and M2, and is further coupled between a plurality of input nodes N_IN1, N_IN2, . . . , N_INN of the capacitor weighted segmentation buffer 100 and the capacitors $C_{11}$-$C_{1N}$ and $C_{21}$-$C_{2N}$, where the input nodes N_IN1-N_INN are arranged to receive the input signals V_IN1-V_INN from a preceding processing stage, respectively. The replica bias circuit 106 is arranged to generate one bias voltage Nbias for the transistor M1 (e.g., NMOS transistor), and generate another bias voltage for the transistor M2 (e.g., PMOS transistor). Please refer to FIG. 2 and FIG. 3. FIG. 2 is a diagram illustrating a first phase (e.g., RST mode) of a discrete operation performed at the capacitor weighted segmentation buffer 100 according to an embodiment of the present invention. FIG. 3 is a diagram illustrating a second phase (e.g., BUF mode) of the discrete operation performed at the capacitor weighted segmentation buffer 100 according to an embodiment of the present invention. For brevity and simplicity, the weighted capacitors $C_{11}$-$C_{1N}$ (N≥2) are collectively represented by one capacitor $C_{top}$ in FIGS. 2-3, the weighted capacitors $C_{21}$-$C_{2N}$ (N≥2) are collectively represented by one capacitor $C_{bot}$ in FIGS. 2-3, and the input signals V_IN1-V_INN are collectively represented by one input signal (which is an analog input) vi. When the push-pull buffer circuit 102 operates in the RST mode due to the switch circuit 104 with the configuration CFG_1, the replica bias circuit 106 generates and outputs the bias voltage Nbias to the control terminal of the transistor M1, and generates and outputs the bias voltage Pbias to the control terminal of the transistor M2. When the push-pull buffer circuit 102 operates in the BUF mode due to the switch circuit 104 with the configuration CFG_2, the replica bias circuit 106 is disconnected from the push-pull buffer circuit 102. Since the replica bias circuit 106 is used to set the bias voltages Nbias and Pbias of the push-pull buffer circuit 102, the bias voltages Nbias and Pbias are stable across PVT variation, such that the gain of the push-pull buffer circuit 102 will not vary across PVT variation. In other words, with the help of the PVT tracking capability of the replica bias circuit 106, the push-pull buffer circuit 102 has a stable and strong buffering capability across all PVT variations.

Furthermore, when the push-pull buffer circuit 102 operates in the RST mode due to the switch circuit 104 with the configuration CFG_1, the input node N_IN1 (particularly, (input signal V_IN1 received by input node N_IN1) is disconnected from capacitors $C_{11}$ and $C_{21}$, the input node N_IN2 (particularly, input signal V_IN2 received by input node N_IN2) is disconnected from capacitors $C_{12}$ and $C_{22}$, and the input node N_INN (particularly, input signal V_INN received by input node N_INN) is disconnected from capacitors $C_{1N}$ and $C_{2N}$. In addition, a common-mode voltage vcm that acts as a reset voltage is applied to bottom plates of all weighted capacitors $C_{11}$-$C_{1N}$ and top plates of all weighted capacitors $C_{21}$-$C_{2N}$. When the push-pull buffer circuit 102 operates in the BUF mode due to the switch circuit 104 with the configuration CFG_2, the input signal V_IN1 received by the input node N_IN1 is delivered to capacitors $C_{11}$ and $C_{21}$ (particularly, bottom plate of capacitor $C_{11}$ and top plate of capacitor $C_{21}$), the input signal V_IN2 received by the input node N_IN2 is delivered to capacitors $C_{12}$ and $C_{22}$ (particularly, bottom plate of capacitor $C_{12}$ and top plate of capacitor $C_{22}$), and the input signal V_INN received by the input node N_INN is delivered to capacitors $C_{1N}$ and $C_{2N}$ (particularly, bottom plate of capacitor $C_{1N}$ and top plate of capacitor $C_{2N}$).

The capacitor weighted segmentation buffer 100 generates an output signal V_OUT (which is an analog output) at the output node N_OUT by combining the input signals V_IN1-V_INN (which are analog inputs) through charge redistribution among the weighted capacitor array $C_{11}$-$C_{1N}$ and the weighted capacitor array $C_{21}$-$C_{2N}$. Hence, the preceding processing stage (which provides the input signals V_IN1-V_INN) can leverage the capacitor weighted segmentation buffer 100 to achieve complexity reduction such as node (energy) reduction. Furthermore, since the push-pull driver circuit 102 is used as a discrete-time buffer rather than a continuous-time buffer, it allows integration of a digital-to-analog converter (DAC) and a buffer. In one exemplary implementation, the capacitor weighted segmentation buffer 100 may be integrated with a DAC to achieve chip area reduction.

Figure 4:
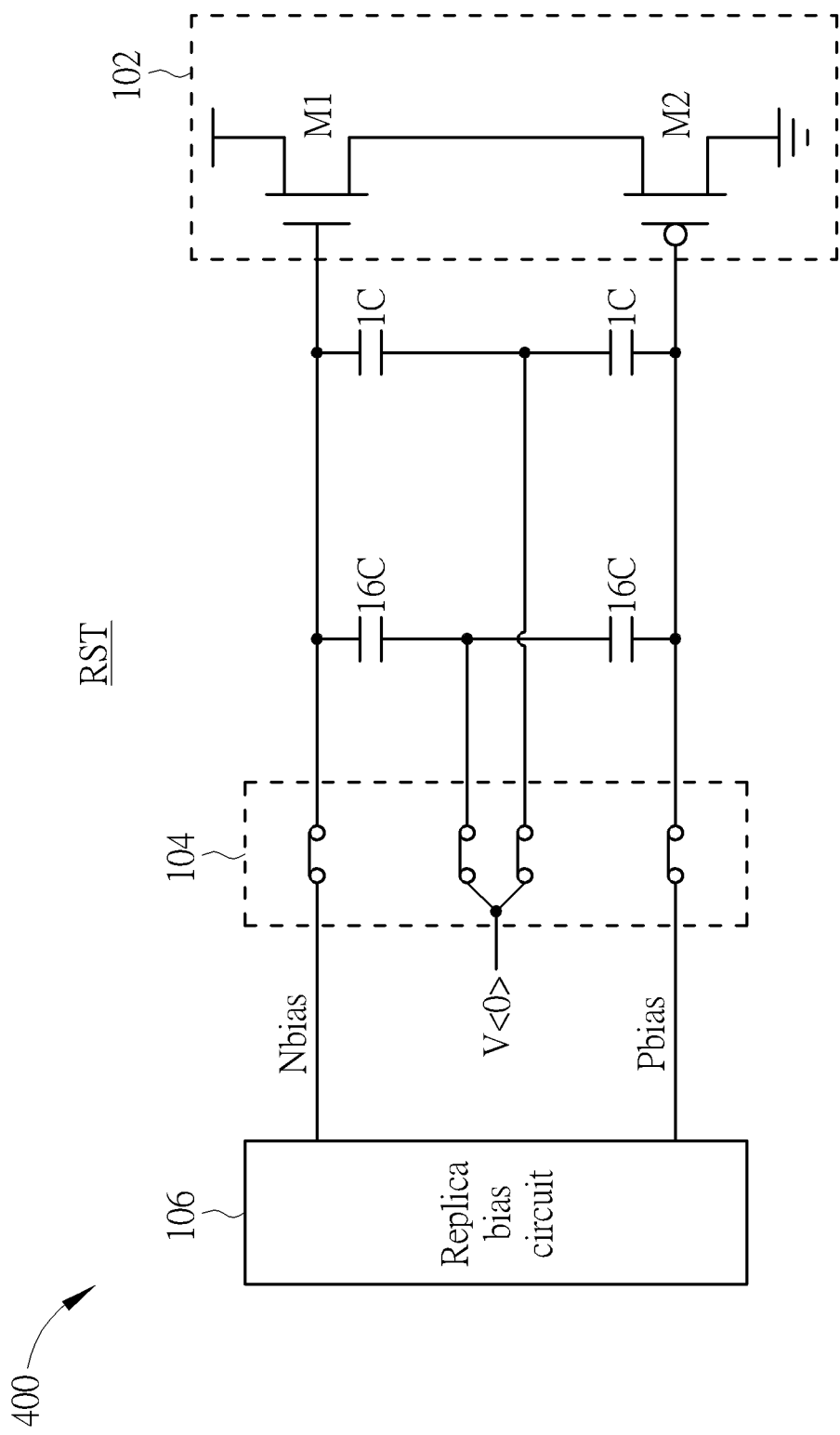
FIG. 4 is a diagram illustrating a first phase (e.g., RST mode) of a discrete operation performed by a first processing circuit with integration of a DAC and a buffer according to an embodiment of the present invention.
Figure 5:
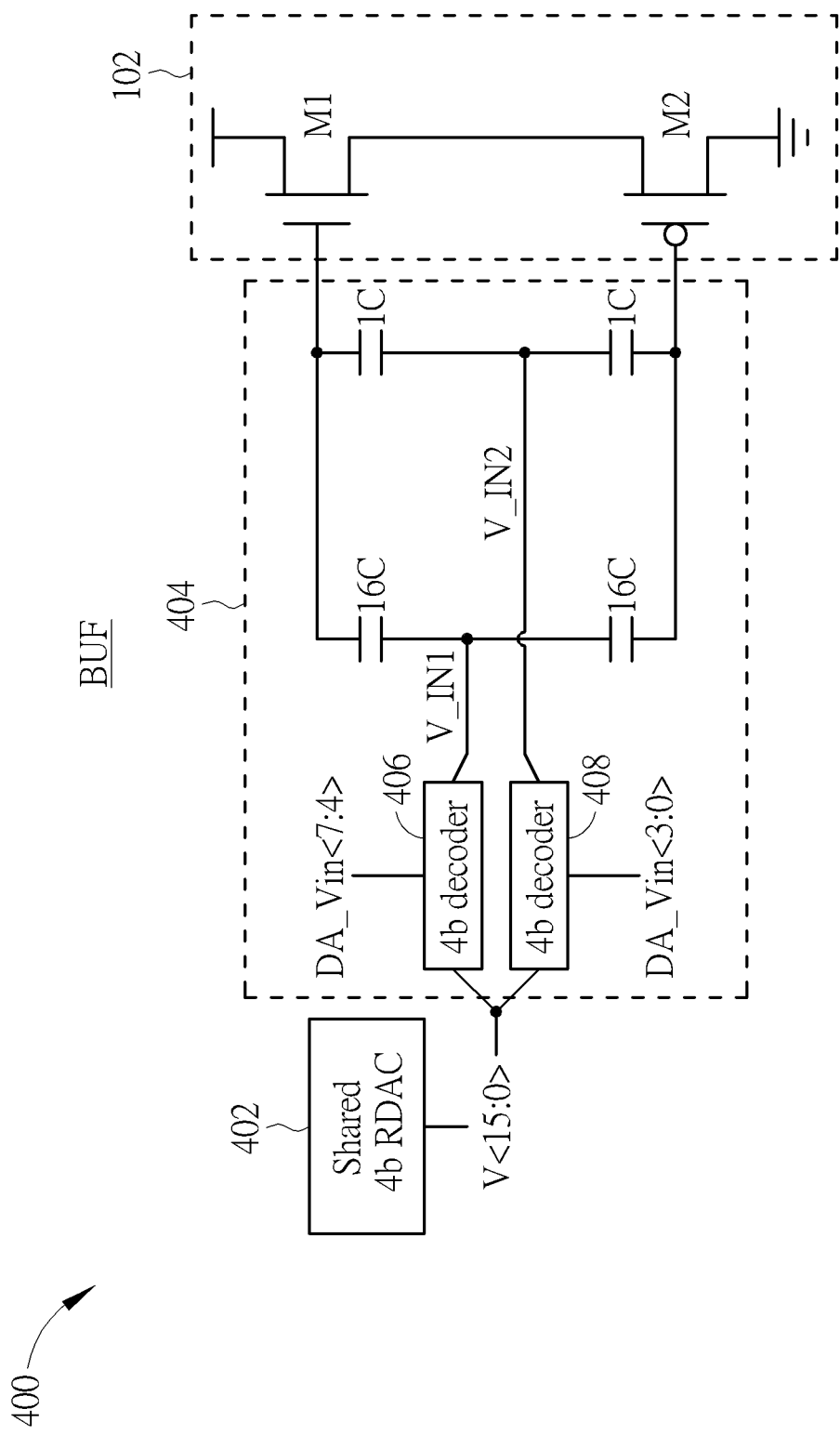
FIG. 5 is a diagram illustrating a second phase (e.g., BUF mode) of the discrete operation performed by the first processing circuit with integration of the DAC and the buffer according to an embodiment of the present invention.

Please refer to FIG. 4 and FIG. 5. FIG. 4 is a diagram illustrating a first phase (e.g., RST mode) of a discrete operation performed at a first processing circuit with integration of a DAC and a buffer according to an embodiment of the present invention. FIG. 5 is a diagram illustrating a second phase (e.g., BUF mode) of the discrete operation performed at the first processing circuit with integration of the DAC and the buffer according to an embodiment of the present invention. In this embodiment, the processing circuit 400 includes the capacitor weighted segmentation buffer 100 with four capacitors $C_{11}$=16C, $C_{1N}$=1C (N=2), $C_{21}$=16C, and $C_{2N}$=1C (N=2). As shown in FIG. 4, when the push-pull buffer circuit 102 operates in the RST mode due to the switch circuit 104 with the configuration CFG_1, the bias voltage Nbias generated from the replica bias circuit 106 is applied to the control terminal of the transistor M1, the bias voltage Pbias generated from the replica bias circuit 106 is applied to the control terminal of the transistor M2, and the common-mode voltage vcm set by V<0> is applied to all capacitors $C_{11}$=16C, $C_{1N}$=1C (N=2), $C_{21}$=16C, and $C_{2N}$=1C (N=2).

The processing circuit 400 employs DAC and buffer integration, and thus further includes a DAC that shares the capacitors $C_{11}$=16C, $C_{1N}$=1C (N=2), $C_{21}$=16C, and $C_{2N}$=1C (N=2) used by the capacitor weighted segmentation buffer 100. In this embodiment, the DAC includes a resistor digital-to-analog converter (RDAC) 402 and a capacitor digital-to-analog converter (CDAC) 404, where the capacitors $C_{11}$=16C, $C_{1N}$=1C (N=2), $C_{21}$=16C, and $C_{2N}$=1C (N=2) are used by the CDAC 404. For a particular application such as an artificial intelligence (AI) application, multiple processing circuits 400 may be used to provide multiple AI inputs to a following processing stage such as an ACIM circuit for analog computation of convolutions. In some embodiments of the present invention, the RDAC 402 used by one processing circuit 400 may be shared by other processing circuits 400 for hardware and cost reduction. However, this is for illustrative purposes only, and is not meant to be a limitation of the present invention.

As shown in FIG. 5, when the push-pull buffer circuit 102 operates in the BUF mode due to the switch circuit 104 with the configuration CFG_2, the input signals V_IN1 and V_IN2 (i.e., V_INN with N=2) generated by the DAC (which includes RDAC 402 and CDAC 404) are delivered to the capacitors $C_{11}$=16C, $C_{1N}$=1C (N=2), $C_{21}$=16C, and $C_{2N}$=1C (N=2). Suppose that a digital code DA_Vin of the DAC (which includes RDAC 402 and CDAC 404) has 8 bits. For example, the digital code DA_Vin<7:0> may be one input data of a neural network used by an AI application. In this embodiment, the digital code DA_Vin<7:0> is divided into two 4-bit (4b) segments, including a most significant bit (MSB) segment DA_Vin<7:4> and a least significant bit (LSB) segment DA_Vin<3:0>. Hence, the RDAC 402 is implemented using a 4b RDAC that is arranged to provide a plurality of reference voltage levels V<15:0>. The CDAC 404 includes two 4b decoders 406 and 408. The 4b decoder 406 acts as a multiplexer, and is arranged to select and output one of the reference voltage levels V<15:0> as the input signal V_IN1 according to the MSB segment DA_Vin<7:4>, where the input signal V_IN1 is applied to the bottom plate of the capacitor $C_{11}$=16C and the top plate of the capacitor $C_{21}$=16C. The 4b decoder 408 acts as a multiplexer, and is arranged to select and output one of the reference voltage levels V<15:0> as the input signal V_IN2 (i.e., V_INN with N=2) according to the LSB segment DA_Vin<3:0>, where the input signal V_IN2 (i.e., V_INN with N=2) is applied to the bottom plate of the capacitor $C_{1N}$=1C (N=2) and the top plate of the capacitor $C_{2N}$=1C (N=2).

The segmentation design shown in FIG. 4 and FIG. 5 is for illustrative purposes only, and is not meant to be a limitation of the present invention. In practice, the segmentation design may be adjusted, depending upon actual design considerations.

Figure 6:
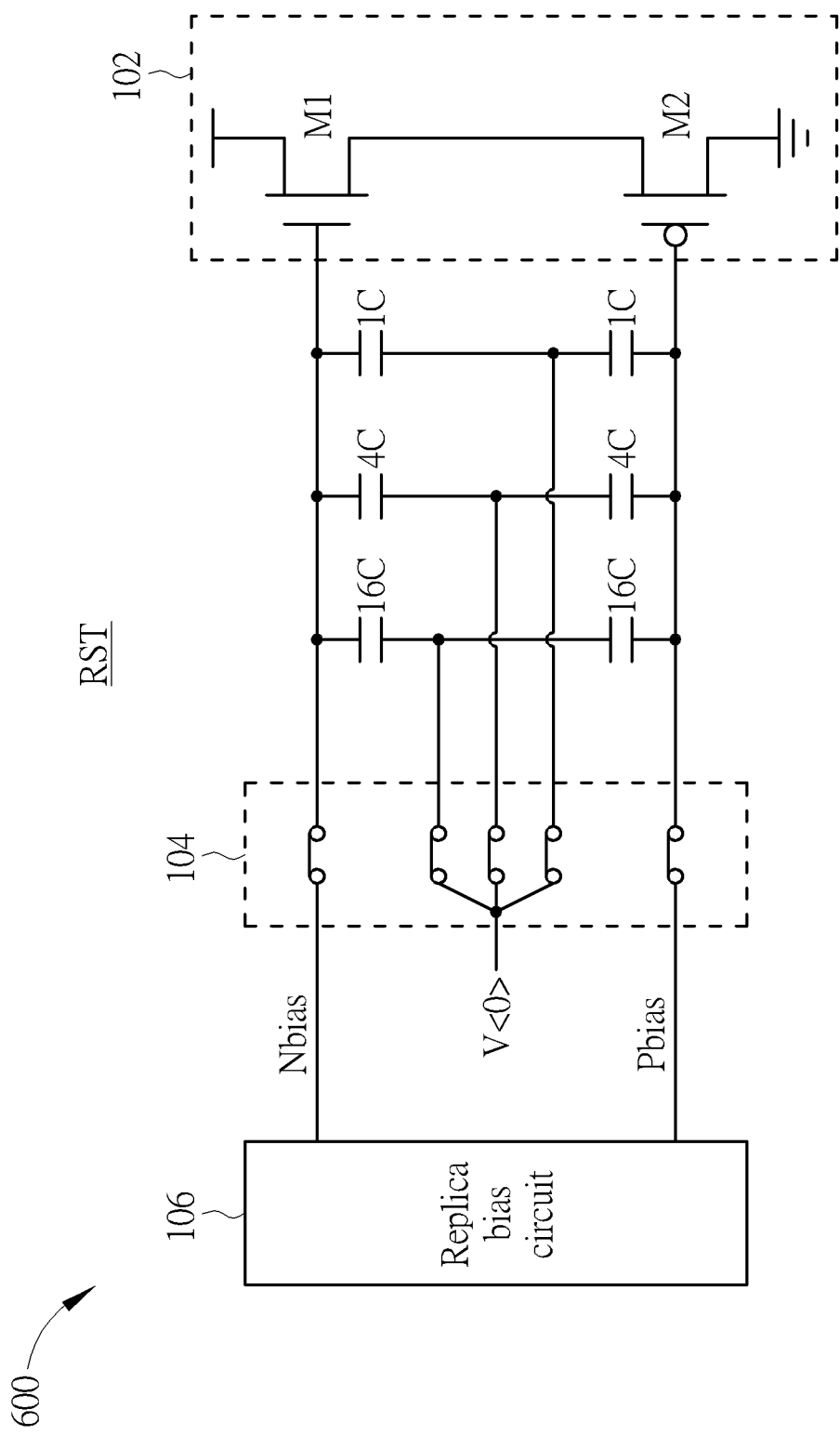
FIG. 6 is a diagram illustrating a first phase (e.g., RST mode) of a discrete operation performed at a second processing circuit with integration of a DAC and a buffer according to an embodiment of the present invention.
Figure 7:
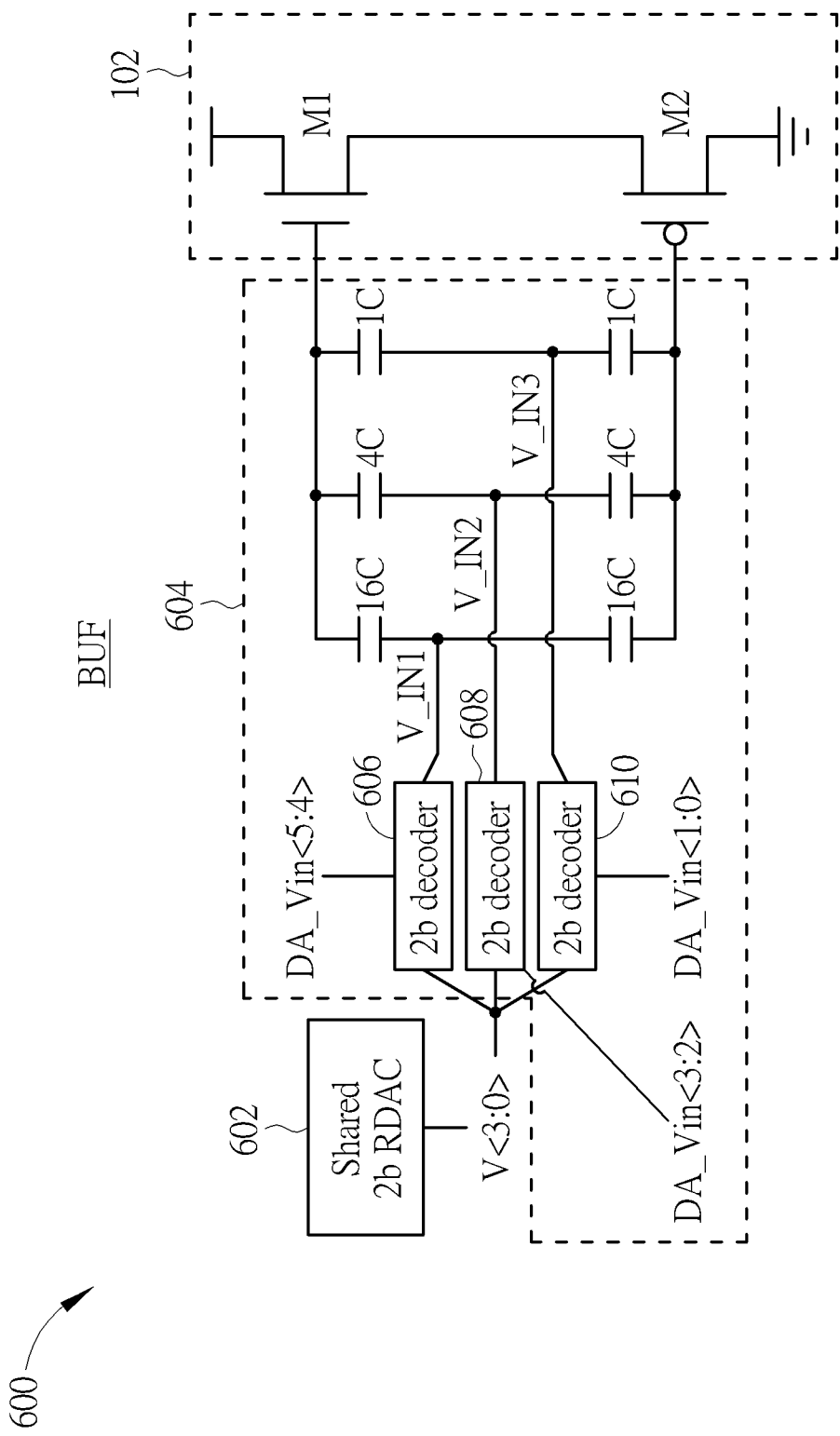
FIG. 7 is a diagram illustrating a second phase (e.g., BUF mode) of the discrete operation performed at the second processing circuit with integration of the DAC and the buffer according to an embodiment of the present invention.

Please refer to FIG. 6 and FIG. 7. FIG. 6 is a diagram illustrating a first phase (e.g., RST mode) of a discrete operation performed at a second processing circuit with integration of a DAC and a buffer according to an embodiment of the present invention. FIG. 7 is a diagram illustrating a second phase (e.g., BUF mode) of the discrete operation performed at the second processing circuit with integration of the DAC and the buffer according to an embodiment of the present invention. In this embodiment, the processing circuit 600 includes the capacitor weighted segmentation buffer 100 with six capacitors $C_{11}$=16C, $C_{12}$=4C, $C_{1N}$=1C (N=3), $C_{21}$=16C, $C_{22}$=4C, and $C_{2N}$=1C (N=3). As shown in FIG. 6, when the push-pull buffer circuit 102 operates in the RST mode due to the switch circuit 104 with the configuration CFG_1, the bias voltage Nbias generated from the replica bias circuit 106 is applied to the control terminal of the transistor M1, the bias voltage Pbias generated from the replica bias circuit 106 is applied to the control terminal of the transistor M2, and the common-mode voltage vom set by V<0> is applied to capacitors $C_{11}$=16C, $C_{12}$=4C, $C_{1N}$=1C (N=3), $C_{21}$=16C, $C_{22}$=4C, and $C_{2N}$=1C (N=3).

The processing circuit 600 employs DAC and buffer integration, and thus further includes a DAC that shares the capacitors $C_{11}$=16C, $C_{12}$=4C, $C_{1N}$=1C (N=3), $C_{21}$=16C, $C_{22}$=4C, and $C_{2N}$=1C (N=3) used by the capacitor weighted segmentation buffer 100. In this embodiment, the DAC includes an RDAC 602 and a CDAC 604, where the capacitors $C_{11}$=16C, $C_{12}$=4C, $C_{1N}$=1C (N=3), $C_{21}$=16C, $C_{22}$=4C, and $C_{2N}$=1C (N=3) are used by the CDAC 604. For a particular application such as an AI application, multiple processing circuits 600 may be used to provide multiple AI inputs to a following processing stage such as an ACIM circuit. Hence, the RDAC 602 used by one processing circuit 600 may be shared by other processing circuits 600 for hardware and cost reduction. However, this is for illustrative purposes only, and is not meant to be a limitation of the present invention.

As shown in FIG. 7, when the push-pull buffer circuit 102 operates in the BUF mode due to the switch circuit 104 with the configuration CFG_2, the input signals V_IN1, V_IN2, and V_IN3 (i.e., V_INN with N=3) generated by the DAC (which includes RDAC 602 and CDAC 604) are delivered to the capacitors $C_{11}$=16C, $C_{12}$=4C, $C_{1N}$=1C (N=3), $C_{21}$=16C, $C_{22}$=4C, and $C_{2N}$=1C (N=3). Suppose that a digital code DA_Vin of the DAC (which includes RDAC 402 and CDAC 404) has 6 bits. For example, the digital code DA_Vin<5:0> may be one input data of a neural network used by an AI application. In this embodiment, the digital code DA_Vin<5:0> is divided into three 2-bit (2b) segments, including an MSB segment DA_Vin<5:4>, a center significant bit (CSB) segment DA_Vin<3:2>, and an LSB segment DA_Vin<1:0>. Hence, the RDAC 602 is implemented using a 2b RDAC that is arranged to provide a plurality of reference voltage levels V<3:0>. The CDAC 604 includes three 2b decoders 606, 608, and 610. The 2b decoder 606 acts as a multiplexer, and is arranged to select and output one of the reference voltage levels V<3:0> as the input signal V_IN1 according to the MSB segment DA_Vin<5:4>, where the input signal V_IN1 is applied to the bottom plate of the capacitor $C_{11}$=16C and the top plate of the capacitor $C_{21}$=16C. The 4b decoder 608 acts as a multiplexer, and is arranged to select and output one of the reference voltage levels V<3:0> as the input signal V_IN2 according to the CSB segment DA_Vin<3:2>, where the input signal V_IN2 is applied to the bottom plate of the capacitor $C_{12}$=4C and the top plate of the capacitor $C_{22}$=4C. The 4b decoder 410 acts as a multiplexer, and is arranged to select and output one of the reference voltage levels V<3:0> as the input signal V_IN3 (i.e., V_INN with N=3) according to the LSB segment DA_Vin<1:0>, where the input signal V_IN3 (i.e., V_INN with N=3) is applied to the bottom plate of the capacitor $C_{1N}$=1C (N=3) and the top plate of the capacitor $C_{2N}$=1C (N=3).

In summary, the processing circuit 400/600 with integration of a DAC and a buffer uses the push-pull buffer circuit 102 biased by the replica bias circuit 106 that has a stable and strong buffering/driving capability across all PVT variations, uses accurate RDAC 402/602 and CDAC 404/604 that provide a high DAC resolution, and uses a proper segmentation for node (energy) reduction. Compared to a conventional DAC that requires $2^8$ nodes to provide $2^8$ voltage levels for selection, the DAC consisting of RDAC 402/602 and CDAC 406/606 requires a fewer number of nodes, and thus occupies a smaller chip area.

Figure 8:
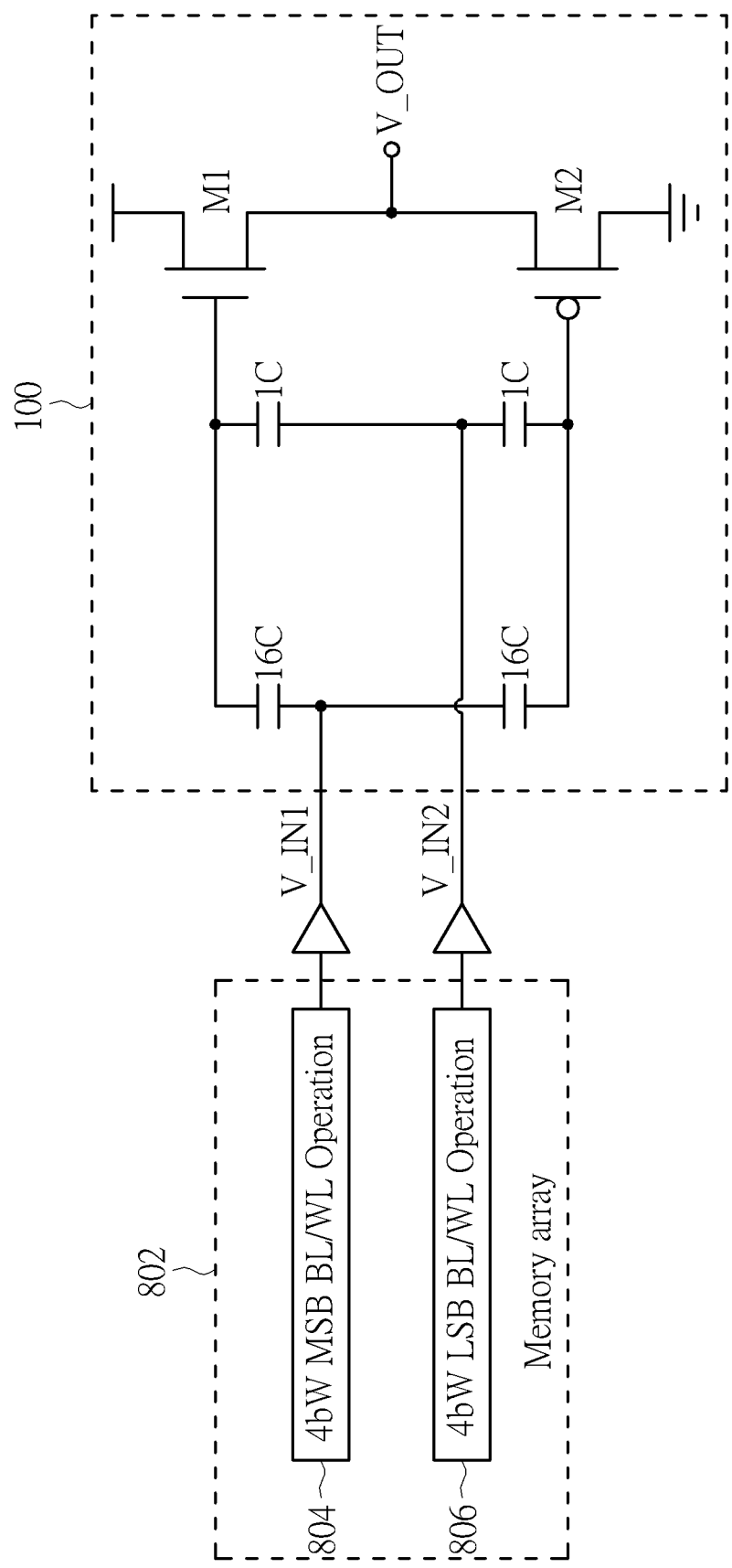
FIG. 8 is a diagram illustrating a first ACIM circuit using a capacitor weighted segmentation buffer as its output buffer according to an embodiment of the present invention.

In another exemplary implementation, the capacitor weighted segmentation buffer 100 may be used as an ACIM buffer. FIG. 8 is a diagram illustrating a first ACIM circuit using a capacitor weighted segmentation buffer as its output buffer according to an embodiment of the present invention. In this embodiment, an ACIM circuit is implemented using a memory array 802. For example, the ACIM circuit is a static random access memory (SRAM)-based CIM circuit that performs the multiplication and accumulation (MAC) operations in an analog manner. In this embodiment, the capacitor weighted segmentation buffer 100 has four capacitors $C_{11}$=16C, $C_{1N}$=1C (N=2), $C_{21}$=16C, and $C_{2N}$=1C (N=2). When the push-pull buffer circuit 102 operates in the RST mode due to the switch circuit 104 with the configuration CFG_1, the bias voltage Nbias generated from the replica bias circuit 106 is applied to the control terminal of the transistor M1, the bias voltage Pbias generated from the replica bias circuit 106 is applied to the control terminal of the transistor M2, and the common-mode voltage vcm is applied to capacitors $C_{11}$=16C, $C_{1N}$=1C (N=2), $C_{21}$=16C, and $C_{2N}$=1C (N=2).

When the push-pull buffer circuit 102 operates in the BUF mode due to the switch circuit 104 with the configuration CFG_2, the input voltages V_IN1 and V_IN2 (i.e., V_INN with N=2) are delivered to the capacitors $C_{11}$=16C, $C_{1N}$=1C (N=2), $C_{21}$=16C, and $C_{2N}$=1C (N=2). As shown in FIG. 8, the input voltages V_IN1 and V_IN2 (i.e., V_INN with N=2) are generated from the ACIM circuit implemented using the memory array 802. Suppose that the ACIM circuit is used for an AI application to deal with MAC operations. Hence, each of the input voltages V_IN1 and V_IN2 (i.e., V_INN with N=2) corresponds to one input data of a neural network used by an AP application. For example, the AI input includes 64 8b input data $IN_1[7:0]$-$IN_{64}[7:0]$, and are converted into analog inputs, for example, by 64 processing circuits 400/600, respectively. The memory array 802 stores 64 8b weights $W_1[7:0]$-$W_{64}[7:0]$, and receives the analog inputs representative of 8b input data $IN_1[7:0]$-$IN_{64}[7:0]$. It is difficult for an ACIM circuit to achieve multiplication and accumulation based on 8b input data and 8b weight. To reduce the complexity, each of the 8b weights $W_1[7:0]$-$W_{64}[7:0]$ is divided into an MSB segment W[7:4] and an LSB segment W[3:0], and the ACIM circuit includes two processing circuits (e.g., SRAM-based CIM circuits) 804 and 806. The processing circuit 804 is arranged to deal with a 4b weight (4bW) MSB bit line/word line (BL/WL) operation. Hence, the processing circuit 804 generates and outputs the input signal V_IN1 to the capacitor weighted segmentation buffer (which acts as an ACIM buffer) 100 according to the analog inputs representative of 8b input data $IN_1[7:0]$-$IN_{64}[7:0]$ and MSB segments $W_1[7:4]$-$W_{64}[7:4]$ of stored 8b weights $W_1[7:0]$-$W_{64}[7:0]$. The processing circuit 806 is arranged to deal with a 4b weight (4bW) LSB BL/WL operation. Hence, the processing circuit 806 generates and outputs the input signal V_IN2 (i.e., V_INN with N=2) to the capacitor weighted segmentation buffer (which acts as an ACIM buffer) 100 according to the analog inputs representative of 8b input data $IN_1[7:0]$-$IN_{64}[7:0]$ and LSB segments $W_1[3:0]$-$W_{64}[3:0]$ of stored 8b weights $W_1[7:0]$-$W_{64}[7:0]$. The generation of the input signals V_IN1 and V_IN2 (i.e., V_INN with N=2) can be simply expressed using the following formulas.

$$V\_IN1 = \Sigma_{k=1}^{64} IN_k[7:0] \cdot W_k[7:4] \qquad (1)$$

$$V\_IN2 = \Sigma_{k=1}^{64} IN_k[7:0] \cdot W_k[3:0] \qquad (2)$$

The capacitor weighted segmentation buffer 100 generates the output signal V_OUT (which is an analog output of $\Sigma_{k=1}^{64} IN_k[7:0] \cdot W_k[7:4]$) by combining the input signals V_IN1 and V_IN2 (i.e., V_INN with N=2) through charge redistribution among the weighted capacitor array $C_{11}$=16C, $C_{1N}$=1C (N=2) and the weighted capacitor array $C_{21}$=16C, $C_{2N}$=1C (N=2).

Figure 9:
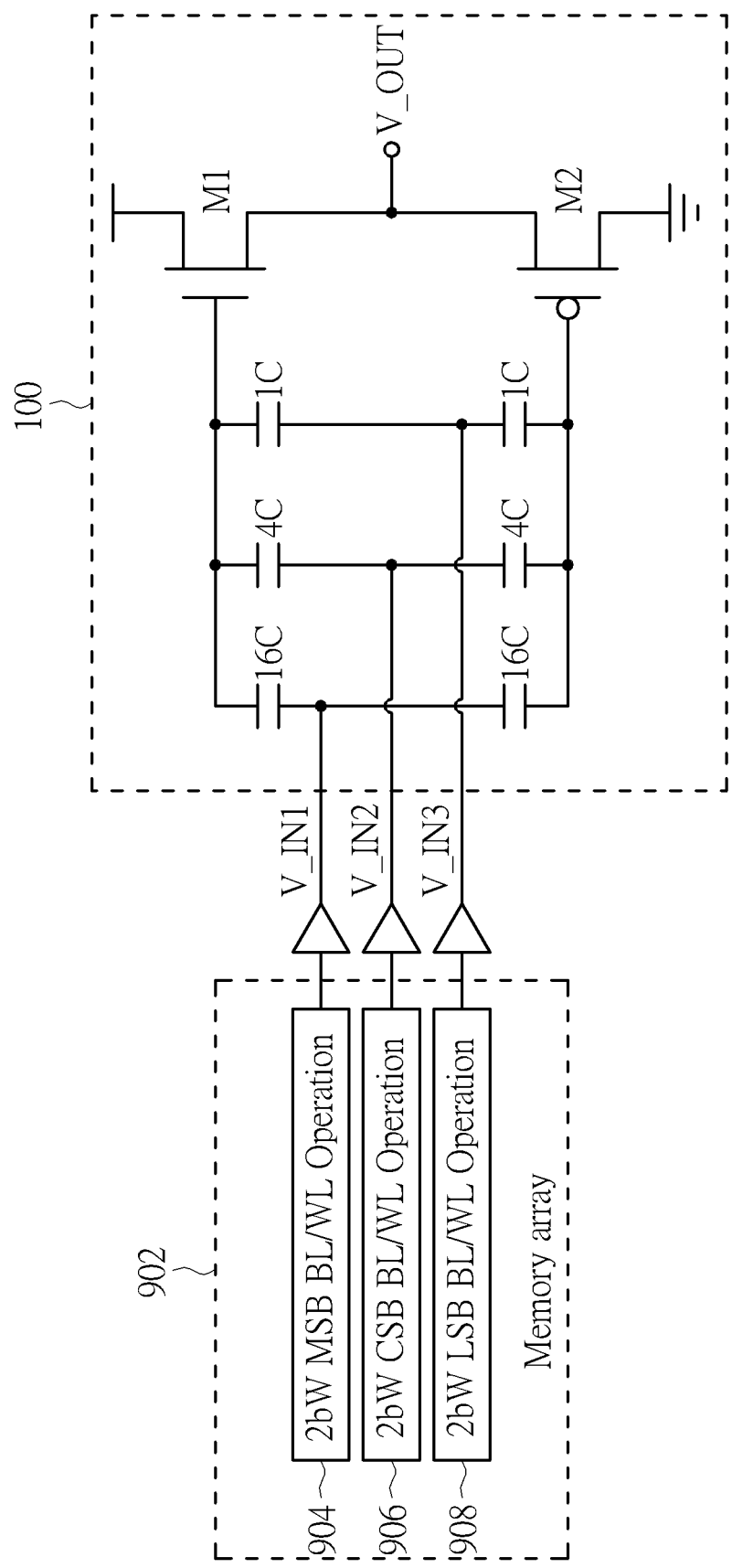
FIG. 9 is a diagram illustrating a second ACIM circuit using a capacitor weighted segmentation buffer as its output buffer according to an embodiment of the present invention.

The segmentation design shown in FIG. 8 is for illustrative purposes only, and is not meant to be a limitation of the present invention. In practice, the segmentation design may be adjusted, depending upon actual design considerations. FIG. 9 is a diagram illustrating a second ACIM circuit using a capacitor weighted segmentation buffer as its output buffer according to an embodiment of the present invention. In this embodiment, an ACIM circuit is implemented using a memory array 902. For example, the ACIM circuit is an SRAM-based CIM circuit that performs the MAC operations in an analog manner. In this embodiment, the capacitor weighted segmentation buffer 100 has six capacitors $C_{11}$=16C, $C_{12}$=4C, $C_{1N}$=1C (N=3), $C_{21}$=16C, $C_{22}$=4C, and $C_{2N}$=1C (N=3). When the push-pull buffer circuit 102 operates in the RST mode due to the switch circuit 104 with the configuration CFG_1, the bias voltage Nbias generated from the replica bias circuit 106 is applied to the control terminal of the transistor M1, the bias voltage Pbias generated from the replica bias circuit 106 is applied to the control terminal of the transistor M2, and the common-mode voltage vom is applied to capacitors $C_{11}$=16C, $C_{12}$=4C, $C_{1N}$=1C (N=3), $C_{21}$=16C, $C_{22}$=4C, and $C_{2N}$=1C (N=3).

When the push-pull buffer circuit 102 operates in the BUF mode due to the switch circuit 104 with the configuration CFG_2, the input voltages V_IN1, V_IN2 and V_IN3 (i.e., V_INN with N=3) are delivered to the capacitors $C_{11}$=16C, $C_{12}$=4C, $C_{1N}$=1C (N=3), $C_{21}$=16C, $C_{22}$=4C, and $C_{2N}$=1C (N=3). As shown in FIG. 9, the input voltages V_IN1, V_IN2, and V_IN3 (i.e., V_INN with N=3) are generated from the ACIM circuit implemented using the memory array 902. Suppose that the ACIM circuit is used for an AI application to deal with MAC operations. Hence, each of the input voltages V_IN1, V_IN2, and V_IN3 (i.e., V_INN with N=3) corresponds to one input data of a neural network used by an AP application. For example, the AI input includes 64 8b input data $IN_1[7:0]$-$IN_{64}[7:0]$, and are converted into analog inputs, for example, by 64 processing circuits 400/600, respectively. The memory array 902 stores 64 6b weights $W_1[5:0]$-$W_{64}[5:0]$, and receives the analog inputs representative of 8b input data $IN_1[7:0]$-$IN_{64}[7:0]$. To reduce the complexity, each of the 6b weights $W_1[5:0]$-$W_{64}[5:0]$ is divided into an MSB segment W[5:4], a CSB segment W[3:2], and an LSB segment W[1:0], and the ACIM circuit includes three processing circuits (e.g., SRAM-based CIM circuits) 904, 906, and 908. The processing circuit 902 is arranged to deal with a 2b weight (2bW) MSB BL/WL operation. Hence, the processing circuit 904 generates and outputs the input signal V_IN1 to the capacitor weighted segmentation buffer (which acts as an ACIM buffer) 100 according to the analog inputs representative of 8b input data $IN_1[7:0]$-$IN_{64}[7:0]$ and MSB segments $W_1[5:4]$-$W_{64}[5:4]$ of stored 6b weights $W_1[5:0]$-$W_{64}[5:0]$. The processing circuit 904 is arranged to deal with a 2b weight (2bW) CSB BL/WL operation. Hence, the processing circuit 906 generates and outputs the input signal V_IN2 to the capacitor weighted segmentation buffer (which acts as an ACIM buffer) 100 according to the analog inputs representative of 8b input data $IN_1[7:0]$-$IN_{64}[7:0]$ and CSB segments $W_1[3:2]$-$W_{64}[3:2]$ of stored 6b weights $W_1[5:0]$-$W_{64}[5:0]$. The processing circuit 908 is arranged to deal with a 2b weight (2bW) LSB BL/WL operation. Hence, the processing circuit 908 generates and outputs the input signal V_IN3 (i.e., V_INN with N=3) to the capacitor weighted segmentation buffer (which acts as an ACIM buffer) 100 according to the analog inputs representative of 8b input data $IN_1[7:0]$-$IN_{64}[7:0]$ and LSB segments $W_1[1:0]$-$W_{64}[1:0]$ of stored 6b weights $W_1[5:0]$-$W_{64}[5:0]$. The generation of the input signals V_IN1, V_IN2, and V_IN3 (i.e., V_INN with N=3) can be simply expressed using the following formulas.

$$V\_IN1 = \Sigma_{k=1}^{64} IN_k[7:0] \cdot W_k[5:4] \qquad (3)$$

$$V\_IN2 = \Sigma_{k=1}^{64} IN_k[7:0] \cdot W_k[3:2] \qquad (4)$$

$$V\_IN3 = \Sigma_{k=1}^{64} IN_k[7:0] \cdot W_k[1:0] \qquad (5)$$

The capacitor weighted segmentation buffer 100 generates the output signal V_OUT (which is an analog output of $\Sigma_{k=1}^{64} IN_k[7:0] \cdot W_k[5:0]$) by combining the input signals V_IN1, V_IN2, and V_IN3 (i.e., V_INN with N=3) through charge redistribution among the weighted capacitor array $C_{11}$=16C, $C_{12}$=4C, $C_{1N}$=1C (N=3) and the weighted capacitor array $C_{21}$=16C, $C_{22}$=4C, and $C_{2N}$=1C (N=3).

In summary, regarding an ACM circuit using the capacitor weighted segmentation buffer 100 as its output buffer, the push-pull buffer circuit 102 biased by the replica bias circuit 106 can offer a stable and strong buffering/driving capability across all PVT variations, the weighted capacitors have accurate capacitance ratios for recombination of input signals, and a proper segmentation of weights leads to node (energy) reduction as well as chip area reduction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A capacitor weighted segmentation buffer comprising:
   a push-pull buffer circuit, comprising:
      a first transistor, having a control terminal, a first connection terminal, and a second connection terminal; and
      a second transistor, having a control terminal, a first connection terminal, and a second connection terminal, wherein the second connection terminal of the first transistor and the second connection terminal of the second transistor are source terminals coupled to an output node of the capacitor weighted segmentation buffer; and
   a plurality of capacitors, comprising:
      a first capacitor, having a first terminal coupled to the control terminal of the first transistor, and a second terminal arranged to receive a first input signal of the capacitor weighted segmentation buffer;

a second capacitor, having a first terminal coupled to the control terminal of the second transistor, and a second terminal arranged to receive the first input signal of the capacitor weighted segmentation buffer;

a third capacitor, having a first terminal coupled to the control terminal of the first transistor, and a second terminal arranged to receive a second input signal of the capacitor weighted segmentation buffer; and a fourth capacitor, having a first terminal coupled to the control terminal of the second transistor, and a second terminal arranged to receive the second input signal of the capacitor weighted segmentation buffer;

wherein each of the first capacitor and the second capacitor has a first capacitance value, and each of the third capacitor and the fourth capacitor has a second capacitance value different from the first capacitance value.

2. The capacitor weighted segmentation buffer of claim 1, wherein the plurality of capacitors further comprise:

a fifth capacitor, having a first terminal coupled to the control terminal of the first transistor, and a second terminal arranged to receive a third input signal of the capacitor weighted segmentation buffer; and a sixth capacitor, having a first terminal coupled to the control terminal of the second transistor, and a second terminal arranged to receive the third input signal of the capacitor weighted segmentation buffer;

wherein each of the fifth capacitor and the sixth capacitor has a third capacitance value different from any of the first capacitance value and the second capacitance value.

3. The capacitor weighted segmentation buffer of claim 1, further comprising:

a switch circuit, arranged to support a first configuration and a second configuration, wherein the push-pull buffer circuit operates in a reset mode when the switch circuit has the first configuration, and operates in a buffer mode when the switch circuit has the second configuration.

4. The capacitor weighted segmentation buffer of claim 3, further comprising:

a replica bias circuit, arranged to generate and output a first bias voltage to the control terminal of the first transistor and generate and output a second bias voltage to the control terminal of the second transistor when the push-pull buffer circuit operates in the reset mode.

5. The capacitor weighted segmentation buffer of claim 4, wherein the replica bias circuit is disconnected from the push-pull buffer circuit when the push-pull buffer circuit operates in the buffer mode.

6. The capacitor weighted segmentation buffer of claim 3, wherein the first input signal is delivered to the second terminal of the first capacitor and the second terminal of the second capacitor when the push-pull buffer circuit operates in the buffer mode; and the second input signal is delivered to the second terminal of the third capacitor and the second terminal of the fourth capacitor when the push-pull buffer circuit operates in the buffer mode.

7. The capacitor weighted segmentation buffer of claim 6, wherein the first input signal is disconnected from the first capacitor and the second capacitor and the second input signal is disconnected from the third capacitor and the fourth capacitor when the push-pull buffer circuit operates in the reset mode.

8. The capacitor weighted segmentation buffer of claim 3, wherein a common-mode voltage is delivered to the second terminal of the first capacitor, the second terminal of the second capacitor, the second terminal of the third capacitor and the second terminal of the fourth capacitor when the push-pull buffer circuit operates in the reset mode.

9. The capacitor weighted segmentation buffer of claim 1, wherein the capacitor weighted segmentation buffer is integrated with a digital-to-analog converter (DAC).

10. The capacitor weighted segmentation buffer of claim 9, wherein the DAC comprises:

a resistor digital-to-analog converter (RDAC), arranged to provide a plurality of reference voltage levels; and a capacitor digital-to-analog converter (CDAC), wherein the plurality of capacitors are used by the CDAC, and the plurality of reference voltage levels are provided to the CDAC.

11. The capacitor weighted segmentation buffer of claim 10, wherein the CDAC comprises:

the first capacitor;
the third capacitor;
the second capacitor;
the fourth capacitor;

a first decoder, arranged to select and output one of the plurality of reference voltage levels as the first input signal according to a first segment of a digital code of the DAC; and a second decoder, arranged to select and output one of the plurality of reference voltage levels as the second input signal according to a second segment of the digital code of the DAC.

12. The capacitor weighted segmentation buffer of claim 11, wherein the digital code is one input data of a neural network.

13. The capacitor weighted segmentation buffer of claim 9, wherein the output node of the capacitor weighted segmentation buffer is coupled to an analog compute-in-memory (ACIM) circuit.

14. The capacitor weighted segmentation buffer of claim 1, wherein the capacitor weighted segmentation buffer is an analog compute-in-memory (ACIM) buffer.

15. The capacitor weighted segmentation buffer of claim 14, wherein each of the first input signal and the second input signal is generated from an ACIM circuit, and the ACIM circuit comprises:

a plurality of processing circuits, comprising:

a first processing circuit, arranged to generate and output the first input signal according to a plurality of analog inputs and first segments of a plurality of stored data; and a second processing circuit, arranged to generate and output the second input signal according to the plurality of analog inputs and second segments of the plurality of stored data.

16. The capacitor weighted segmentation buffer of claim 15, wherein each of the plurality of processing circuits is a multiply-accumulate (MAC) circuit.

17. The capacitor weighted segmentation buffer of claim 15, wherein each of the analog inputs corresponds to one input data of a neural network.

* * * * *